US012796016B2

(12) United States Patent
Li et al.

(10) Patent No.: US 12,796,016 B2
(45) Date of Patent: Nov. 10, 2026

(54) SUPER-JUNCTION MOSFET DEVICE HAVING A FIELD STOP REGION

(71) Applicant: CHINA RESOURCES MICROELECTRONICS (CHONGQING) CO., LTD, Chongqing (CN)

(72) Inventors: Ping Li, Chongqing (CN); Rongyao Ma, Chongqing (CN)

(73) Assignee: China Resources Microelectronics (Chongqing) Co. , Ltd, Chongqing (CN)

( * ) Notice: Subject to any disclaimer, the term of this patent is extended or adjusted under 35 U.S.C. 154(b) by 398 days.

(21) Appl. No.: 18/573,856

(22) PCT Filed: Nov. 28, 2022

(86) PCT No.: PCT/CN2022/134726
§ 371 (c)(1),
(2) Date: Dec. 22, 2023

(87) PCT Pub. No.: WO2023/098626
PCT Pub. Date: Jun. 8, 2023

(65) Prior Publication Data

US 2024/0321952 A1 Sep. 26, 2024

(30) Foreign Application Priority Data

Dec. 3, 2021 (CN) ......................... 202111466727.5

(51) Int. Cl.
*H10D 62/10* (2025.01)
*H10D 30/63* (2025.01)
*H10D 62/13* (2025.01)

(52) U.S. Cl.
CPC ........... *H10D 62/111* (2025.01); *H10D 30/63* (2025.01); *H10D 62/124* (2025.01); *H10D 62/151* (2025.01)

(58) Field of Classification Search
CPC .. H10D 62/111; H10D 62/124; H10D 62/151; H10D 30/63
(Continued)

(56) References Cited

U.S. PATENT DOCUMENTS 8,258,032 B2 * 9/2012 Yoshikawa .......... H10D 62/111 257/E21.384
8,975,136 B2 * 3/2015 Willmeroth .......... H10D 12/032 257/339
(Continued)

FOREIGN PATENT DOCUMENTS

CN 102810567 A 12/2012
CN 108899370 A 11/2018
(Continued)

OTHER PUBLICATIONS

International Search Report and Written Opinion (with English translation) for corresponding Application No. PCT/CN2022/134726, dated Jan. 5, 2023, 12 pages.
(Continued)

*Primary Examiner* — Eric W Jones
(74) *Attorney, Agent, or Firm* — Dority & Manning, PA

(57) ABSTRACT

A super-junction MOSFET device includes a plurality of cell structures. Each of the cell structures includes a drain electrode, an N-type drain electrode layer, an N-type buffer layer, an N-type field stop region, a first P-type body region, a second P-type body region, a first P-pillar, a second P-pillar, an N-pillar, a first N-type source region, a second N-type source region, a first P-type body contact region, a second P-type body contact region, a gate structure and a
(Continued)

source electrode. The N-type field stop region is arranged in the N-type buffer layer. The vertical projection of the N-type field stop region on the N-type drain electrode layer has spacing regions. The doping concentration of the N-type field stop region is higher than the doping concentration of the N-type buffer layer.

10 Claims, 4 Drawing Sheets

(58) Field of Classification Search
USPC .......................................................... 257/288
See application file for complete search history.

(56) References Cited

U.S. PATENT DOCUMENTS

2002/0185705 A1* 12/2002 Saitoh ................ H10D 30/0291 257/E29.066
2003/0207536 A1* 11/2003 Miyasaka ............ H10D 62/111 257/E21.418
2014/0231909 A1* 8/2014 Willmeroth .......... H10D 62/058 257/339
2014/0367771 A1 12/2014 Chatty et al.

FOREIGN PATENT DOCUMENTS

CN 110061057 A 7/2019
CN 112086507 A 12/2020
CN 113224164 A 8/2021
CN 214848641 U 11/2021

OTHER PUBLICATIONS

Extended European Search Report for corresponding Application No. 22900430.4, dated Mar. 26, 2025, 12 pages.
Office Action (with English translation) received in corresponding Application No. CN 202111466727.5, dated Apr. 25, 2026.

* cited by examiner

SUPER-JUNCTION MOSFET DEVICE HAVING A FIELD STOP REGION

CROSS-REFERENCE TO RELATED APPLICATIONS

The present application is the national phase under 35 U.S.C. § 371 of PCT International Application No. PCT/CN2022/134726, which has an international filing date of Nov. 28, 2022 and claims priority to Chinese patent application No. 202111466727.5, filed with China National Intellectual Property Administration on Dec. 3, 2021, and entitled "SUPER-JUNCTION MOSFET DEVICE". The contents of the above identified PCT international application and the Chinese patent application are hereby incorporated in their entireties by reference for all purposes.

TECHNICAL FIELD

The present disclosure belongs to the technical field of semiconductor devices, and relates to a super-junction MOSFET device.

BACKGROUND

Super-junction power MOSFETs are widely used because of their low on-resistance, easy driving, and fast switching speed. N-type pillar regions and P-type pillar regions are interleaved with each other in a body region of the super-junction MOSFET, and compensate for each other when subjected to a voltage, which is a main feature of the super-junction MOSFET. Compared to conventional power MOSFETs, the super-junction MOSFETs have lower on-resistance and parasitic capacitance, which enables them to be widely used in higher power and higher frequency scenarios.

In the case of taking an inductor as a load, it is usually necessary to add a freewheeling diode to conduct current when the super-junction MOSFET is turned off. It is a cost-saving and efficiency-improving way to use a body diode of the super-junction MOSFET as a freewheeling diode. However, the body diode of the super-junction MOSFET has an extremely poor reverse recovery characteristic. Specifically, the body diode of the super-junction MOSFET has a high reverse recovery charge and a low reverse recovery softness factor. The high reverse recovery charge will increase the loss of super-junction MOSFET during the switching process, thereby reducing the efficiency of the entire system. The low reverse recovery softness factor will cause high dI/dt in the switching circuit, resulting in voltage overshoot and RLC oscillation, which will directly cause the device to burn out in severe cases.

Currently, in order to improve the softness factor of the body diode of super-junction MOSFET, it is widely used to add a lightly doped buffer layer between the pillar region and the substrate region of the super-junction MOSFET. On the other hand, in order to reduce the reverse recovery charge of the body diode of the super-junction MOSFET, a method of reducing life times of carriers in the body diode of the super-junction MOSFET, or a method of introducing Schottky contacts on the surface of the super-junction MOSFET to reduce the injection of non-equilibrium carriers may be commonly employed to reduce the reverse recovery charge.

However, the above techniques are often accompanied by the sacrifice of other electrical characteristics while improving the reverse recovery characteristics of the super-junction MOSFETs. Specifically, although the thicker the N-type buffer layer, the higher the reverse recovery softness factor of the body diode, the reverse recovery charges will increase significantly, and the on-resistance of the super-junction MOSFET will also increase. Although a carrier lifetime control technology, such as introducing effective recombination centers through doping heavy metal impurities such as gold or platinum, or performing high-energy electron irradiation at the end of device fabrication, is adapted to reduce the life times of the carriers, but it also increases the leakage current and the on-resistance of the super-junction MOSFET. In addition, integrating Schottky diodes on the surface of the super-junction MOSFET will also increase the leakage current of the super-junction MOSFET.

Therefore, there is an urgent need for a super-junction MOSFET that can greatly reduce the reverse recovery charge of the device and improve the reverse recovery softness without increasing the specific on-resistance and the leakage current of the device.

SUMMARY

In view of the above-described disadvantages of the conventional technology, it is an object of the present disclosure to provide a super-junction MOSFET device for solving the problem in the conventional technology that improvement of the super-junction reverse recovery characteristics is often accompanied by sacrifices of other electrical characteristics.

To achieve the above object and other related objects, the present disclosure provides a super-junction MOSFET device including a plurality of cell structures, and each of the cell structure includes:

a drain electrode;

an N-type drain electrode layer arranged on the drain electrode;

an N-type buffer layer arranged on the N-type drain electrode layer;

an N-type field stop region arranged in the N-type buffer layer, the N-type field stop region having a vertical projection with spaced regions on the N-type drain electrode layer, and the N-type field stop region having a higher doping concentration than the N-type buffer layer;

first and second P-pillars arranged on the N-type buffer layer and spaced apart from each other in a horizontal direction;

first and second P-type body regions arranged on the first and second P-pillars respectively, and spaced apart from each other in the horizontal direction;

an N-pillar arranged on the N-type buffer layer, sandwiched between the first P-pillar and the second P-pillar, and sandwiched between the first P-type body region and the second P-type body region;

first and second N-type source regions respectively arranged on upper surface layers of the first and second P-type body regions;

first and second P-type body contact regions respectively arranged on the upper surface layers of the first and second P-type body regions, the first P-type body contact region being arranged on a side of the first N-type source region away from the second P-type body region, and the second P-type body contact region being arranged on a side of the second N-type source region away from the first P-type body region;

a gate structure arranged on the first P-type body region, the N-pillar and the second P-type body region, and in contact with the first N-type source region and the second N-type source region; and a source electrode covering the gate structure, and is in contact with the first N-type source region, the second N-type source region, the first P-type body contact region and the second P-type body contact region.

Optionally, the doping concentration of the N-type field stop region is at least times the doping concentration of the N-type buffer layer.

Optionally, the N-type field stop region includes at least two divisions that are not in contact with each other.

Optionally, the spaced regions do not completely partition the N-type field stop region, and the N-type field stop region is integrally connected.

Optionally, a top surface of the N-type field stop region is spaced apart from a top surface of the N-type buffer layer by a preset distance, and a bottom surface of the N-type field stop region is spaced apart from a bottom surface of the N-type buffer layer by a preset distance.

Optionally, a top surface of the N-type field stop region is in contact with at least one of the first P-pillar, the N-pillar or the second P-pillar, and a bottom surface of the N-type field stop region is in contact with the N-type drain electrode layer.

Optionally, a top surface of the N-type field stop region is spaced apart from the top surface of the N-type buffer layer by a preset distance, and a bottom surface of the N-type field stop region is in contact with the N-type drain electrode layer.

Optionally, a top surface of the N-type field stop region is in contact with at least one of the first P-pillar, the N-pillar or the second P-pillar, and a bottom surface of the N-type field stop region is spaced apart from a bottom surface of the N-type buffer layer by a preset distance.

Optionally, the vertical projection of the N-type field stop region on the N-type drain electrode layer overlaps with vertical projections of the first P-pillar, the N-pillar and the second P-pillar on the N-type drain electrode layer.

Optionally, the gate structure includes a gate dielectric layer, a gate conductive layer and an insulating protective layer, the gate conductive layer is arranged on the gate dielectric layer, and the insulating protective layer covers a top surface and side surfaces of the gate conductive layer.

As described above, in the super-junction MOSFET device according to the present disclosure, an N-type field stop region is introduced into the N-type buffer layer, and the vertical projection of the N-type field stop region on the N-type drain electrode layer has spaced regions. Since the doping concentration of the N-type field stop region is much higher than that of the N-type buffer layer, when the body diode of the super-junction MOSFET is turned on, substantially no conductance modulation occurs in the N-type field stop region, which means that the N-type field stop region is substantially free of non-equilibrium carriers when the super-junction diode is turned on. As a result, the reverse recovery charge of the super-junction diode will be greatly reduced. In addition, when a high voltage is applied to the drain terminal and the source terminal, the electric field terminates at the N-type field stop region and cannot through the N-type field stop region. Therefore, during the reverse recovery of the super-junction diode, the non-equilibrium carriers in the N-type buffer layer located below and on the left and right sides of the N-type field stop region cannot be directly extracted by the electric field, so the reverse recovery softness will be greatly increased.

Since no carrier lifetime control technology is used, the leakage current of the device is not increased according to the present disclosure. In addition, due to the introduction of the N-type field stop region, the on-resistance of the super-junction MOSFET is greatly reduced, that is, according to the present disclosure, the on-resistance of the device can be reduced without increasing the leakage current of the device, while reducing the reverse recovery charge and improving the reverse recovery softness factor.

DESCRIPTION OF REFERENCE NUMERALS

Figure 1:
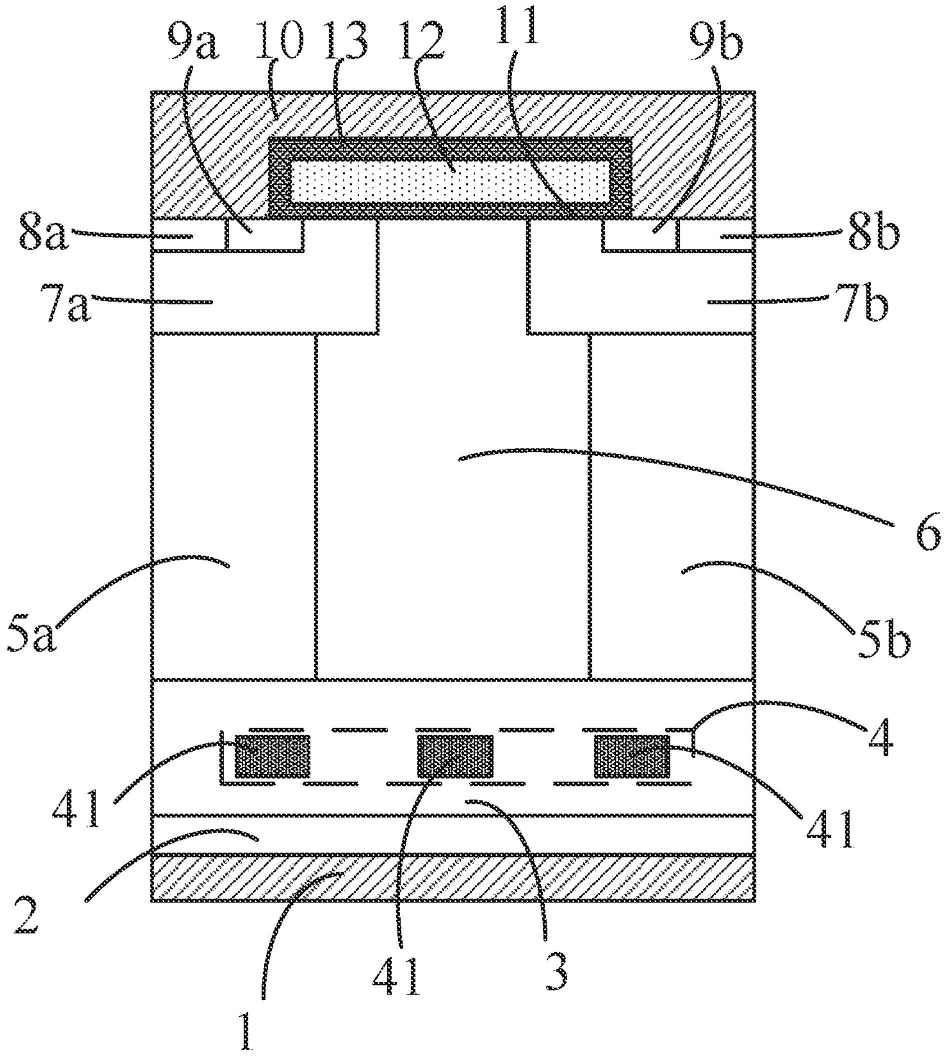
FIG. 1 is a schematic diagram showing a sectional structure of a cell structure of a super-junction MOSFET device according to a first embodiment of the present disclosure.

1 drain electrode
2 N-type drain electrode layer
3 N-type buffer layer
4 N-type field stop region
41 N type field stop region division
5*a* first P-pillar
5*b* second P-pillar
6 N-pillar
7*a* first P-type body region
7*b* second P-type body region
8*a* first P-type body contact region
8*b* second P-type body contact region
9*a* first N-type source region
9*b* second N-type source region
10 source electrode
11 gate dielectric layer
12 gate conductive layer
13 insulating protective layer

DETAILED DESCRIPTION OF THE EMBODIMENTS

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

Please refer to FIG. 1 to FIG. 4. It should be noted that the figures provided in these embodiments merely illustrate the basic conception of the present disclosure schematically. Therefore, the figures only show the components related to the present disclosure, and are not drawn in accordance with the quantity, shapes, and sizes of the components during actual implementation. The actual implementation of the components may be an arbitrary change in the pattern, quantity, and proportion of each component, and the layout of the components may be more complex.

First Embodiment

In this embodiment, a super-junction MOSFET device is provided. The super-junction MOSFET device includes a plurality of cell structures. Please refer to FIG. 1, which is a schematic diagram showing a sectional structure of the cell structure. The cell structure includes a drain electrode 1, an N-type drain electrode layer 2, an N-type buffer layer 3, an N-type field stop region 4, a first P-pillar 5*a*, a second P-pillar 5*b*, an N-pillar 6, a first P-type body region 7*a*, a second P-type body region 7*b*, a first N-type source region 9*a*, a second N-type source region 9*b*, a first P-type body contact region 8*a*, a second P-type body contact region 8*b*, a gate structure and a source electrode 10.

Specifically, the N-type drain electrode layer 2 is arranged on the drain electrode 1, and the N-type buffer layer 3 is arranged on the N-type drain electrode layer 2. The drain electrode 1 is made of a conductive metal material. The N-type drain electrode layer 2 and the N-type buffer layer 3 are made of a material that includes but is not limited to N-type doped silicon, and the N-type drain electrode layer 2 has a higher doping concentration than the N-type buffer layer 3.

Specifically, the first P-pillar 5*a* and the second P-pillar 5*b* are arranged on the N-type buffer layer 3, and are spaced apart from each other in a horizontal direction. The first P-type body region 7*a* and the second P-type body region 7*b* are respectively arranged on the first P-pillar 5*a* and the second P-pillar 5*b*, and are spaced apart from each other in the horizontal direction. The N-pillar 6 is arranged on the N-type buffer layer 3, sandwiched between the first P-pillar 5*a* and the second P-pillar 5*b*, and sandwiched between the first P-type body region 7*a* and the second P-type body region 7*b*.

It should be noted that a P-pillar is shared by two neighboring cell structures, that is, in the horizontal direction, the P-pillar and the N-pillar are arranged alternately.

Specifically, the first N-type source region 9*a* and the second N-type source region 9*b* are respectively arranged on upper surface layers of the first P-type body region 7*a* and the second P-type body region 7*b*, and the doping concentrations of the first N-type source region 9*a* and the second N-type source region 9*b* are respectively higher than the doping concentrations of the first P-type body region 7*a* and the second P-type body region 7*b*.

Specifically, the first P-type body contact region 8*a* and the second P-type body contact region 8*b* are respectively arranged on the upper surface layers of the first P-type body region 7*a* and the second P-type body region 7*b*, the first P-type body contact region 8*a* is arranged on a side of the first N-type source region 9*a* away from the second P-type body region 7*b*, and the second P-type body contact region 8*b* is arranged on a side of the second N-type source region 9*b* away from the first P-type body region 7*a*. The doping concentrations of the first P-type body contact region 8*a* and the second P-type body contact region 8*b* are respectively higher than the doping concentrations of the first P-type body contact region 7*a* and the second P-type body region 7*b*.

Specifically, the gate structure is arranged on the first P-type body region 7*a*, the N-pillar 6 and the second P-type body region 7*b*, and is in contact with the first N-type source region 9*a* and the second N-type source region 9*b*. In this embodiment, the gate structure includes a gate dielectric layer 11, a gate conductive layer 12 and an insulating protective layer 13. The gate conductive layer 12 is arranged on the gate dielectric layer 11, and the insulating protective layer 13 covers a top surface and side surfaces of the gate conductive layer 12. The gate dielectric layer 11 includes but is not limited to a silicon dioxide layer, the gate conductive layer 12 includes but is not limited to a polysilicon layer, and the insulating protective layer 13 includes but is not limited to a silicon dioxide layer.

Specifically, the source electrode 10 covers the gate structure and is in contact with the first N-type source region 9*a*, the second N-type source region 9*b*, the first P-type body contact region 8*a* and the second P-type body contact region 8*b*. The source electrode 10 may be made of a conductive metal material.

Specifically, the N-type field stop region 4 is arranged in the N-type buffer layer 3, and the N-type field stop region 4 has a vertical projection with spaced regions on the N-type drain electrode layer 2.

It should be noted that the spaced regions may not completely partition the N-type field stop region 4, and the N-type field stop region 4 is integrally connected. For example, the N-type field stop region 4 has a cross-section in the form of an S shape, a grid shape, a comb shape, a ring shape, and so on.

As an example, the vertical projection of the N-type field stop region 4 on the N-type drain electrode layer 2 preferably overlaps with the vertical projections of the first P-pillar 5*a*, the N-pillar 6 and the second P-pillar 5*b* on the N-type drain electrode layer, that is, the N-type field stop region 4 faces each of the first P-pillar 5*a*, the N-pillar 6 and the second P-pillar 5*b*.

As an example, the N-type field stop region 4 includes at least two divisions 41 that are not in contact with each other. In this embodiment, the N-type field stop region 4 is partitioned into three divisions 41 that are not in contact with each other by the spaced regions, and the three divisions 41 face the first P-pillar 5*a*, the N-pillar 6 and the second P-pillar 5*b*, respectively.

As an example, the top surface of the N-type field stop region 4 is spaced apart from the top surface of the N-type buffer layer 3 by a preset distance, and the bottom surface of the N-type field stop region 4 is spaced apart from the bottom surface of the N-type buffer layer 3 by a preset distance, that is, in this embodiment, the N-type field stop region 4 is completely wrapped by the N-type buffer layer 3.

Specifically, the doping concentration of the N-type field stop region 4 is higher than that of the N-type buffer layer 3. In this embodiment, the doping concentration of the N-type field stop region 4 is at least 10 times that of the N-type buffer layer 3. Since the doping concentration of the N-type field stop region 4 is much higher than that of the N-type buffer layer 3, when the body diode of the super-junction MOSFET is turned on, substantially no conductance modulation occurs in the N-type field stop region 4, which means that the N-type field stop region 4 is substantially free of non-equilibrium carriers when the super-junction diode is turned on. As a result, the reverse recovery charge of the super-junction diode will be greatly reduced. In addition, when a high voltage is applied to the drain terminal and the source terminal, the electric field terminates at the N-type field stop region 4 and cannot pass through the N-type field stop region 4. Therefore, during the reverse recovery of the super-junction diode, the non-equilibrium carriers in the N-type buffer layer 3 located below and on the left and right sides of the N-type field stop region 4 cannot be directly extracted by the electric field, so the reverse recovery softness will be greatly increased.

Since no carrier lifetime control technology is used, the leakage current of the device is not increased according to the present disclosure. In addition, due to the introduction of the N-type field stop region, the on-resistance of the super-junction MOSFET is greatly reduced, that is, according to the present disclosure, the on-resistance of the device can be reduced without increasing the leakage current of the device, while reducing the reverse recovery charge and improving the reverse recovery softness factor.

Second Embodiment

In this embodiment, the technical solution is basically the same as that in the first embodiment, except that in the first embodiment, the top surface of the N-type field stop region 4 is spaced apart from the top surface of the N-type buffer layer 3 by a preset distance, and the bottom surface of the N-type field stop region 4 is spaced apart from the bottom surface of the N-type buffer layer 3 by a preset distance, and in this embodiment, the top surface of the N-type field stop region 4 is in contact with at least one of the first P-pillar 5*a*, the N-pillar 6 and the second P-pillar 5*b*, or the bottom surface of the N-type field stop region 4 is in contact with the N-type drain electrode layer 2.

Figure 2:
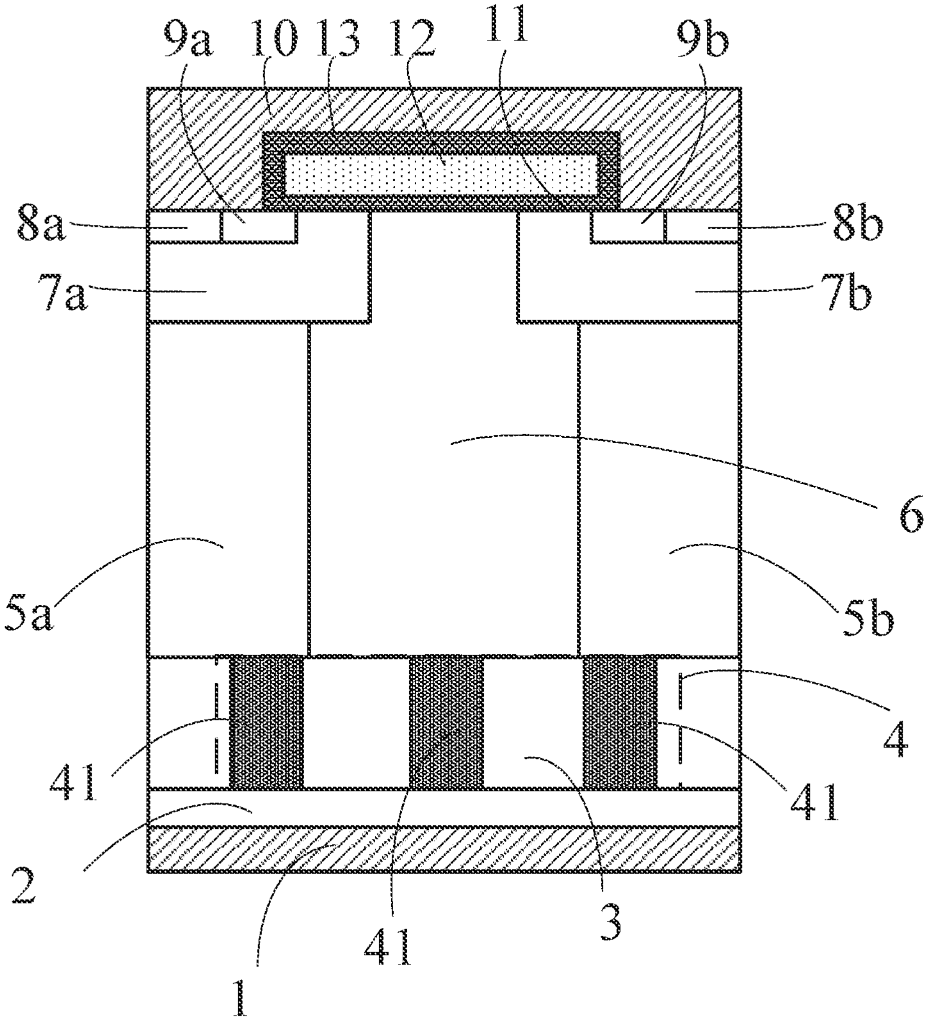
FIG. 2 is a schematic diagram showing a sectional structure of a cell structure of a super-junction MOSFET device according to a second embodiment of the present disclosure.

As an example, please refer to FIG. 2, which is a schematic diagram showing a sectional structure of a cell structure of the super-junction MOSFET device in this embodiment. In this embodiment, the top surface of the N-type field stop region 4 is in contact with each of the first P-pillar 5*a*, the N-pillar 6 and the second P-pillar 5*b*, and the bottom surface of the N type field stop region 4 is in contact with the N type drain electrode layer 2.

Third Embodiment

Figure 3:
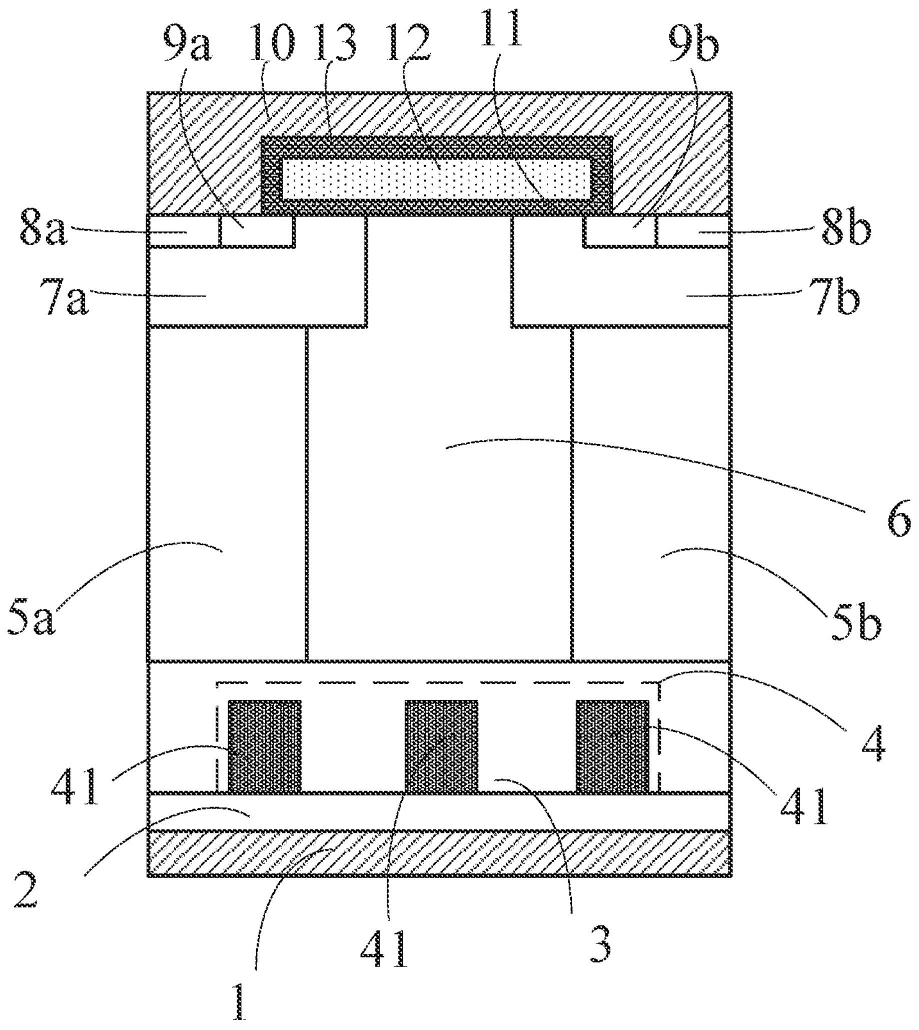
FIG. 3 is a schematic diagram showing a sectional structure of a cell structure of a super-junction MOSFET device according to a third embodiment of the present disclosure.

In this embodiment, the technical solution is basically the same as that in the first embodiment, except that in the first embodiment, the top surface of the N-type field stop region 4 is spaced apart from the top surface of the N-type buffer layer 3 by a preset distance, and the bottom surface of the N-type field stop region 4 is spaced apart from the bottom surface of the N-type buffer layer 3 by a preset distance, and in this embodiment, as shown in FIG. 3, the top surface of the N-type field stop region 4 is spaced apart from the top surface of the N-type buffer layer 3 by a preset distance, and the bottom surface of the N-type field stop region 4 is in contact with the N-type drain electrode layer 2.

Fourth Embodiment

In this embodiment, the technical solution is basically the same as that in the first embodiment, except that in the first embodiment, the top surface of the N-type field stop region 4 is spaced apart from the top surface of the N-type buffer layer 3 by a preset distance, and the bottom surface of the N-type field stop region 4 is spaced apart from the bottom surface of the N-type buffer layer 3 by a preset distance, and in this embodiment, the top surface of the N-type field stop region 4 is in contact with at least one of the first P-pillar 5*a*, the N-pillar 6 or the second P-pillar 5*b*, and the bottom surface of the N-type field stop region 4 is spaced apart from the bottom surface of the N-type buffer layer 3 by a preset distance.

Figure 4:
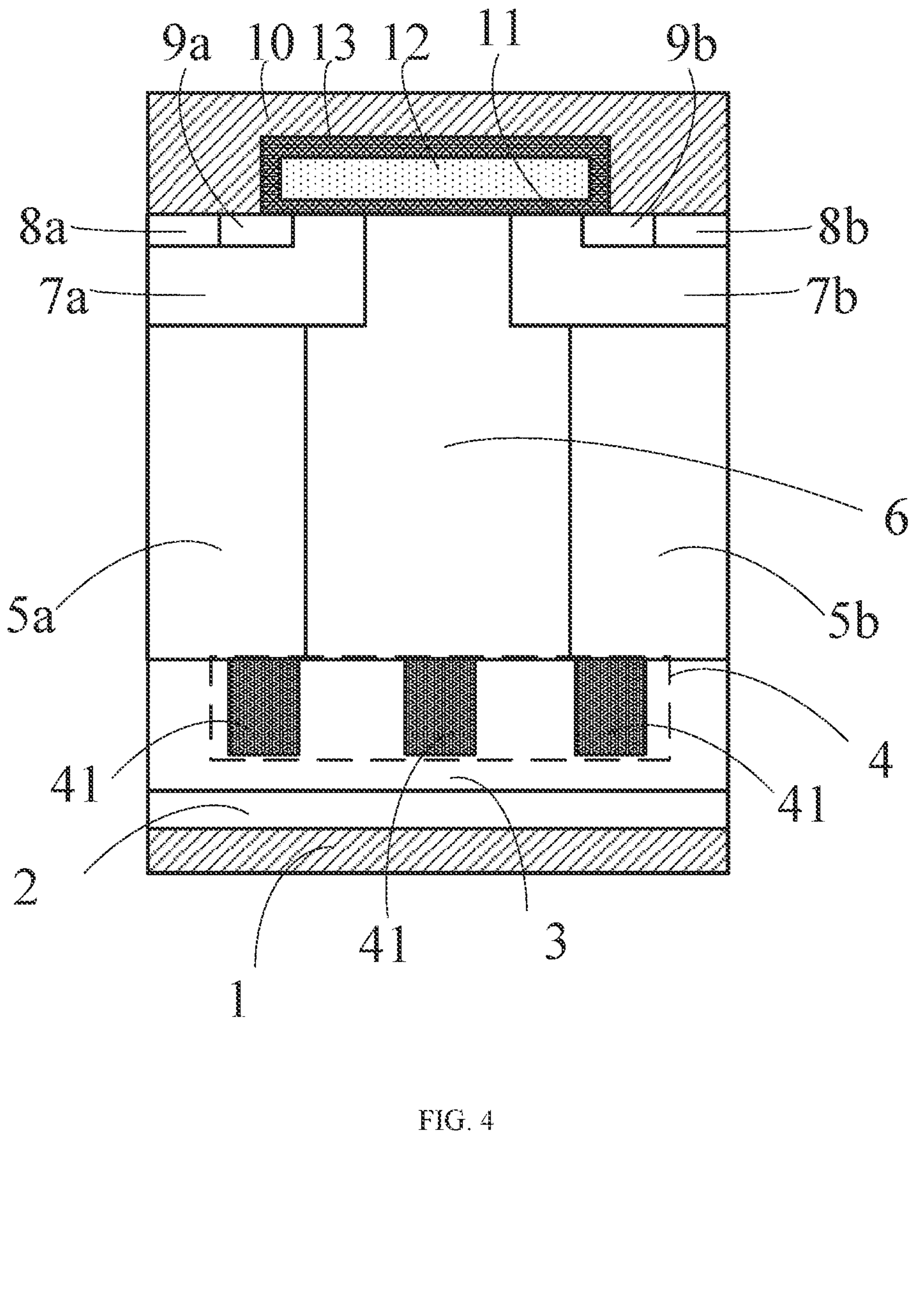
FIG. 4 is a schematic diagram showing a sectional structure of a cell structure of a super-junction MOSFET device according to a fourth embodiment of the present disclosure.

As an example, please refer to FIG. 4, which is a schematic diagram showing a sectional structure of a cell structure of the super-junction MOSFET device in this embodiment. In this embodiment, the top surface of the N-type field stop region 4 is in contact with each of the first P-pillar 5*a*, the N-pillar 6 and the second P-pillar 5*b*, and the bottom surface of the N-type field stop region 4 is spaced apart from the bottom surface of the N-type buffer layer 3 by a preset distance.

To sum up, in the super-junction MOSFET device according to the present disclosure, an N-type field stop region is introduced into the N-type buffer layer, and the vertical projection of the N-type field stop region on the N-type drain electrode layer has spaced regions. Since the doping concentration of the N-type field stop region is much higher than that of the N-type buffer layer, when the body diode of the super-junction MOSFET is turned on, substantially no conductance modulation occurs in the N-type field stop region, which means that the N-type field stop region is substantially free of non-equilibrium carriers when the super-junction diode is turned on. As a result, the reverse recovery charge of the super-junction diode will be greatly reduced. In addition, when a high voltage is applied to the drain terminal and the source terminal, the electric field terminates at the N-type field stop region and cannot pass through the N-type field stop region. Therefore, during the reverse recovery of the super-junction diode, the non-equilibrium carriers in the N-type buffer layer located below and on the left and right sides of the N-type field stop region cannot be directly extracted by the electric field, so the reverse recovery softness will be greatly increased. Since no carrier lifetime control technology is used, the leakage current of the device is not increased according to the present disclosure. In addition, due to the introduction of the N-type field stop region, the on-resistance of the super-junction MOSFET is greatly reduced, that is, according to the present disclosure, the on-resistance of the device can be reduced without increasing the leakage current of the device, while reducing the reverse recovery charge and improving the reverse recovery softness factor. Therefore, the present disclosure effectively overcomes various shortcomings in conventional technologies and has high industrial utilization value.

The above embodiments only illustrate the principles and effects of the present disclosure, but are not used to limit the present disclosure. Anyone familiar with this technology can modify or change the above embodiments without departing from the spirit and scope of the present disclosure. Therefore, all equivalent modifications or changes made by those with ordinary knowledge in the technical field without departing from the spirit and technical ideas disclosed in the present disclosure shall still be covered by the claims of the present disclosure.

The invention claimed is:

1. A super-junction MOSFET device comprising a plurality of cell structures, the cell structure comprising:

a drain electrode;

an N-type drain electrode layer arranged on the drain electrode;

an N-type buffer layer arranged on the N-type drain electrode layer;

an N-type field stop region arranged in the N-type buffer layer, the N-type field stop region having a vertical projection with spaced regions on the N-type drain electrode layer, and the N-type field stop region having a higher doping concentration than the N-type buffer layer;

first and second P-pillars arranged on the N-type buffer layer and spaced apart from each other in a horizontal direction;

first and second P-type body regions respectively arranged on the first and second P-pillars, and spaced apart from each other in the horizontal direction;

an N-pillar arranged on the N-type buffer layer, sandwiched between the first P-pillar and the second P-pillar, and sandwiched between the first P-type body region and the second P-type body region;

first and second N-type source regions respectively arranged on upper surface layers of the first and second P-type body regions;

first and second P-type body contact regions respectively arranged on the upper surface layers of the first and second P-type body regions, wherein the first P-type body contact region is arranged on a side of the first N-type source region away from the second P-type body region, and the second P-type body contact region is arranged on a side of the second N-type source region away from the first P-type body region;

a gate structure arranged on the first P-type body region, the N-pillar and the second P-type body region, and in contact with the first N-type source region and the second N-type source region; and a source electrode covering the gate structure, and in contact with the first N-type source region, the second N-type source region, the first P-type body contact region and the second P-type body contact region, wherein a top surface of the N-type field stop region is spaced apart from a top surface of the N-type buffer layer by a preset distance, and a bottom surface of the N-type field stop region is spaced apart from a bottom surface of the N-type buffer layer by another preset distance, so that the N-type field stop region is completely wrapped by the N-type buffer layer.

2. The super-junction MOSFET device according to claim 1, wherein the doping concentration of the N-type field stop region is at least 10 times the doping concentration of the N-type buffer layer.

3. The super-junction MOSFET device according to claim 1, wherein the spaced regions do not completely partition the N-type field stop region, and the N-type field stop region is integrally connected.

4. The super-junction MOSFET device according to claim 3, wherein the vertical projection of the N-type field stop region on the N-type drain electrode layer overlaps with vertical projections of the first P-pillar, the N-pillar and the second P-pillar on the N-type drain electrode layer.

5. The super-junction MOSFET device according to claim 1, wherein the N-type field stop region includes at least two divisions that are not in contact with each other.

6. The super-junction MOSFET device according to claim 5, wherein the N-type field stop region includes three divisions that are not in contact with each other, and vertical projections of the three divisions on the N-type drain electrode layer overlap with vertical projections of the first P-pillar, the N-pillar and the second P-pillar on the N-type drain electrode layer respectively.

7. The super-junction MOSFET device according to claim 1, wherein the gate structure includes a gate dielectric layer, a gate conductive layer and an insulating protective layer, the gate conductive layer is arranged on the gate dielectric layer, and the insulating protective layer covers a top surface and side surfaces of the gate conductive layer.

8. The super-junction MOSFET device according to claim 1, wherein the doping concentration of the N-type drain electrode layer is higher than the doping concentration of the N-type buffer layer.

9. The super-junction MOSFET device according to claim 1, wherein the doping concentrations of the first N-type source region and the second N-type source region are respectively higher than the doping concentrations of the first P-type body region and the second P-type body region.

10. The super-junction MOSFET device according to claim 1, wherein the doping concentrations of the first P-type body contact region and the second P-type body contact region are respectively higher than the doping concentrations of the first P-type body region and the second P-type body region.

* * * * *